(12) United States Patent
Wu et al.

(10) Patent No.: US 7,199,001 B2
(45) Date of Patent: Apr. 3, 2007

(54) METHOD OF FORMING MIM CAPACITOR ELECTRODES

(75) Inventors: Chih-Ta Wu, Hsinchu (TW); Kuo-Yin Lin, Taichung (TW); Tsung-Hsun Huang, Taipei (TW); Chung-Yi Yu, Hsin-Chu (TW); Lan-Lin Chao, Sindian (TW); Yeur-Luen Tu, Taichung (TW); Hsing-Lien Lin, Hsin-Chu (TW); Chia-Shiung Tsai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 158 days.

(21) Appl. No.: 10/811,657

(22) Filed: Mar. 29, 2004

(65) Prior Publication Data
US 2005/0215004 A1   Sep. 29, 2005

(51) Int. Cl.
*H01L 21/8242* (2006.01)
(52) U.S. Cl. .............. 438/239; 438/396; 438/386; 257/E21.008
(58) Field of Classification Search ............ 438/239, 438/396, 386, 253, 243
See application file for complete search history.

(56) References Cited

U.S. PATENT DOCUMENTS

| 6,596,583 | B2 * | 7/2003 | Agarwal et al. | 438/255 |
| 6,919,273 | B1 * | 7/2005 | Otsuki et al. | 438/683 |
| 2002/0190294 | A1 * | 12/2002 | Iizuka et al. | 257/296 |
| 2003/0067023 | A1 * | 4/2003 | Olewine et al. | 257/296 |
| 2004/0046197 | A1 * | 3/2004 | Basceri et al. | 257/296 |

* cited by examiner

*Primary Examiner*—Michael Trinh
(74) *Attorney, Agent, or Firm*—Tung & Associates

(57) ABSTRACT

A novel method for forming electrodes in the fabrication of an MIM (metal-insulator-metal) capacitor, is disclosed. The method improves MIM capacitor performance by preventing plasma-induced damage to a dielectric layer during deposition of a top electrode on the dielectric layer, as well as by reducing or preventing the formation of an interfacial layer between the dielectric layer and the electrode or electrodes, in fabrication of the MIM capacitor. The method typically includes the patterning of crown-type capacitor openings in a substrate; depositing a bottom electrode in each of the crown openings; subjecting the bottom electrode to a rapid thermal processing (RTP) or furnace anneal step; depositing a dielectric layer on the annealed bottom electrode; depositing a top electrode on the dielectric layer using a plasma-free CVD (chemical vapor deposition) or ALD (atomic layer deposition) process; and patterning the top electrode of each MIM capacitor.

10 Claims, 2 Drawing Sheets

METHOD OF FORMING MIM CAPACITOR ELECTRODES

FIELD OF THE INVENTION

The present invention relates to methods for fabricating MIM (metal-insulator-metal) capacitors on a semiconductor wafer substrate. More particularly, the present invention relates to an MIM capacitor electrode fabrication method in which a top electrode is formed using a plasma-free deposition process at relatively low temperature to reduce or prevent electrical performance degradation of the capacitor.

BACKGROUND OF THE INVENTION

In the fabrication of semiconductor integrated circuits, metal conductor lines are used to interconnect the multiple components in device circuits on a semiconductor wafer. A general process used in the deposition of metal conductor line patterns on semiconductor wafers includes deposition of a conducting layer on the silicon wafer substrate; formation of a photoresist or other mask such as titanium oxide or silicon oxide, in the form of the desired metal conductor line pattern, using standard lithographic techniques; subjecting the wafer substrate to a dry etching process to remove the conducting layer from the areas not covered by the mask, thereby leaving the metal layer in the form of the masked conductor line pattern; and removing the mask layer typically using reactive plasma and chlorine gas, thereby exposing the top surface of the metal conductor lines. Typically, multiple alternating layers of electrically conductive and insulative materials are sequentially deposited on the wafer substrate, and conductive layers at different levels on the wafer may be electrically connected to each other by etching vias, or openings, in the insulative layers and filling the vias using aluminum, tungsten or other metal to establish electrical connection between the conductive layers.

A current drive in the semiconductor device industry is to produce semiconductors having an increasingly large density of integrated circuits which are ever-decreasing in size. These goals are achieved by scaling down the size of the circuit features in both the lateral and vertical dimensions. Vertical downscaling requires that the thickness of gate oxides on the wafer be reduced by a degree which corresponds to shrinkage of the circuit features in the lateral dimension. While there are still circumstances in which thicker gate dielectrics on a wafer are useful, such as to maintain operating voltage compatibility between the device circuits manufactured on a wafer and the current packaged integrated circuits which operate at a standard voltage, ultrathin gate dielectrics will become increasingly essential for the fabrication of semiconductor integrated circuits in the burgeoning small/fast device technology.

The ongoing advances in the field of fabricating miniaturized electronic integrated circuits (ICs) has involved the fabrication of multiple layers of interconnects, or the layers of separate electrical conductors which are formed on top of a substrate and connect various functional components of the substrate and other electrical connections to the IC. Electrical connections between the interconnect layers and the functional components on the substrate are achieved by via interconnects, which are post- or plug-like vertical connections between the conductors of the interconnect layers and the substrate. ICs often have five or more interconnect layers formed on top of the substrate.

Only a relatively short time ago, it was impossible or very difficult to construct an IC with more than one or two layers of interconnects. The topology variations created by forming multiple layers on top of one another resulted in such significant depth of focus problems with lithographic processes that any further additions of layers were nearly impossible to achieve. However, recent advances in semiconductor fabrication planarization techniques, such as chemical mechanical polishing (CMP), have been successful in smoothing relatively significant variations in the height or topography of each interconnect layer. As a result of the smoothing, or planarization, conventional lithographic processes are repetitively used without significant limitation to form considerably more layers of interconnects than had previously been possible.

The multiple interconnect layers occupy volume within the IC, although they do not necessarily occupy additional substrate surface area. Nevertheless, because surface area and volume are critical considerations in Ics, attention has been focused on the effective use of the space between the interconnect layers. Normally, the space between the interconnect layers is occupied by an insulating material, known as an interlayer dielectric (ILD) or intermetal dielectric (IMD), to insulate the electrical signals conducted by the various conductors of the interconnect layers from each other and from the functional components in the underlying substrate.

One effective use for the space between the interconnect layers is the incorporation of capacitors between the interconnect layers in the IMD insulating material separating the interconnect layers. These capacitors form part of the functional components of the IC. Previously, capacitors were constructed in the first layers of IC fabrication immediately above the substrate alongside other structures, such as transistors, so the capacitors were formed of generally the same material used to construct the other functional components, such as polysilicon. Capacitors formed of these materials are generally known as poly-plate capacitors.

Because the conductors of the interconnect layers are metal in construction, the capacitors formed between the interconnect layers are preferably of a metal-insulator-metal (MIM) construction to take advantage of processing steps and performance enhancements. MIM capacitors are very valuable in many applications of semiconductor technology. For example, MIMs can be used in RF circuits, analog ICs, high power microprocessor units (MPUs), and DRAM cells. An MIM capacitor has metal plates which are usually formed on the metal conductors of the interconnect layers. Because metal fabrication is required for the conductors of the interconnect layers, the simultaneous or near-simultaneous formation of the metal capacitor plates is readily accomplished without significant additional process steps and manufacturing costs.

A typical process flow for MIM capacitor fabrication includes crown capacitor patterning, bottom electrode deposition, bottom electrode CMP (chemical mechanical planarization), dielectric layer deposition, and top electrode deposition and patterning. Normally, dielectric materials having a high dielectric constant (k) are used as the insulating dielectric layer between the electrodes. The dielectric layer is typically a thin (<100 angstroms in thickness) low-k dielectric film in order to achieve a low EOT (equivalent oxide thickness), which corresponds to a high capacitance.

The electrodes of an MIM capacitor are fabricated using metals such as TiN, TaN, WN, etc., which are deposited using CVD (chemical vapor deposition) or ALD (atomic layer deposition) methods. Generally, due to their compatibility to semiconductor fabrication processes, MOCVD (metal organic chemical vapor deposition) films are used as electrode materials. MIM capacitors used for logic-friendly embedded DRAM features require a low-temperature electrode deposition process (typically less than about 500 degrees C.).

Due to the typically extremely small thickness of the dielectric layer, formation of an interfacial layer between the dielectric layer and the bottom electrode, as well as between the dielectric layer and the top electrode, significantly impacts EOT scaling down in the effort to achieve ever-decreasing capacitances. Top electrode interaction with thin, high-k dielectric materials has been found to adversely impact the electrical performance of MIM capacitors, including excessive junction leakage and lower breakdown voltage. Recent research indicates that the electrical performance of MIM capacitors is strongly correlated with plasma damage induced in the dielectric layer during deposition of the top electrode on the dielectric layer. This is particularly problematic with regard to dielectric layers which are fabricated using high-k dielectric materials. Accordingly, a new and improved electrode fabrication method is needed to reduce the formation of an interfacial layer between a dielectric layer and an electrode, as well as prevent plasma-induced damage to the dielectric layer during electrode layer deposition, during the fabrication of an MIM capacitor on a substrate.

An object of the present invention is to provide a novel method of forming MIM capacitor electrodes.

Another object of the present invention is to provide a novel method of forming electrodes of an MIM capacitor to enhance the electrical performance characteristics of the capacitor.

Still another object of the present invention is to provide a novel MIM capacitor electrode fabrication method which reduces the formation of interfacial layers in an MIM capacitor.

Yet another object of the present invention is to provide a novel MIM capacitor electrode fabrication method which improves MIM capacitor performance by preventing plasma-induced damage to a dielectric layer during deposition of a top electrode on the dielectric layer in fabrication of the MIM capacitor.

A still further object of the present invention is to provide a novel MIM capacitor electrode fabrication method which includes patterning of crown-type capacitor openings in a substrate; deposition of a bottom electrode in each of the capacitor openings; rapid thermal processing (RTP) or thermal annealing of the bottom electrode; deposition of a dielectric layer on the bottom electrode; plasma-free deposition of a top electrode on the dielectric layer; and patterning of the top electrode.

SUMMARY OF THE INVENTION

In accordance with these and other objects and advantages, the present invention is generally directed to a novel method for forming electrodes in the fabrication of an MIM (metal-insulator-metal) capacitor. The method improves MIM capacitor performance by preventing plasma-induced damage to a dielectric layer during deposition of a top electrode on the dielectric layer, as well as by reducing or preventing the formation of an interfacial layer between the dielectric layer and the electrode or electrodes, in fabrication of the MIM capacitor. The method typically includes the patterning of crown-type capacitor openings in a substrate; depositing a bottom electrode in each of the crown openings; subjecting the bottom electrode to a rapid thermal processing (RTP) or furnace anneal step; depositing a dielectric layer on the annealed bottom electrode; depositing a top electrode on the dielectric layer using a plasma-free CVD (chemical vapor deposition) or ALD (atomic layer deposition) process; and patterning the top electrode of each MIM capacitor.

BRIEF DESCRIPTION OF THE DRAWINGS

The invention will now be described, by way of example, with reference to the accompanying drawings, in which.

DETAILED DESCRIPTION OF THE INVENTION

Figure 1A:
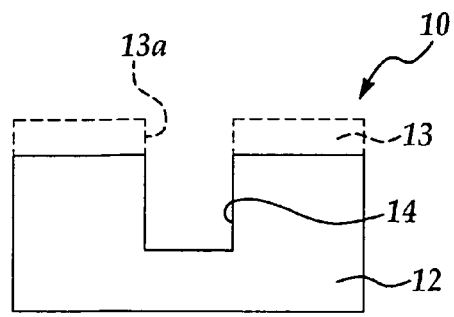
FIGS. 1A–1G are cross-sectional views illustrating sequential fabrication of a crown-type MIM capacitor according to the MIM electrode fabrication method of the present invention.

The present invention generally contemplates a novel method for forming electrodes in the fabrication of an MIM (metal-insulator-metal) capacitor. The method improves the electrical performance of an MIM capacitor by preventing plasma-induced damage to a high-k dielectric layer as a top electrode is deposited on the dielectric layer during fabrication of the capacitor. The method of the invention further improves capacitor performance by reducing or preventing the formation of an interfacial layer between the dielectric layer and a top electrode and a bottom electrode during fabrication of the capacitor.

In a typical process flow according to the method of the present invention, crown-type capacitor openings are initially patterned in a substrate. A bottom electrode, typically TiN, is then deposited in each of the capacitor openings. The bottom electrode is subjected to a rapid thermal processing (RTP) or furnace anneal step, after which a dielectric layer is deposited on the annealed bottom electrode. Using a plasma-free CVD (chemical vapor deposition) or ALD (atomic layer deposition) process, a top electrode is deposited on the dielectric layer. Finally, the top electrode of each MIM capacitor is patterned.

Referring to FIGS. 1A–1G, a partially-fabricated MIM capacitor is generally indicated by reference numeral 10. The MIM capacitor 10 includes a substrate 12, which may be an oxide, for example. The substrate 12 is deposited on a wafer (not shown) or on layers (not shown) previously deposited on the wafer. After fabrication, the MIM capacitor 10 is disposed in electrical contact with circuit devices (not shown) fabricated on the wafer, as is known by those skilled in the art.

As shown in FIG. 1A, multiple crown-type capacitor openings 14 (one of which is shown) are initially patterned and etched in the substrate 12. This is carried out typically by depositing a photoresist layer 13 on the substrate 12, forming multiple photoresist openings 13a in the photoresist layer 13, and etching the capacitor openings 14 in the substrate 12 according to the pattern and configuration of the photoresist openings 13a. The capacitor openings 14 may be etched in the substrate 12 using etching techniques known by those skilled in the art.

Figure 1B:
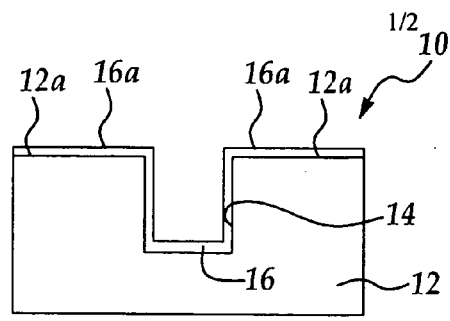

As shown in FIG. 1B, a bottom electrode 16, which is typically TiN, is next deposited on the sidewalls and bottom of each of the capacitor openings 14, as well as on the upper surface of the substrate 12. This may be carried out using a thermal CVD (chemical vapor deposition) process, an ALD (atomic layer deposition) process or other suitable process known by those skilled in the art. The bottom electrode 16 has a thickness of typically about 50~100 A.

ALD involves the deposition of successive monolayers over a substrate inside a deposition chamber which is typically maintained at subatmospheric pressure. An example of such a method includes feeding a single vaporized precursor gas into the deposition chamber to form a first monolayer over the substrate. Then, flow of the precursor gas into the chamber is ceased and an inert purge gas is introduced into the chamber to remove any remaining unreacted precursor gas from the chamber. A second precursor gas which is different from the first is then introduced into the chamber to form a second monolayer on the first monolayer. The two precursor gases can be alternately and repeatedly introduced into the chamber, interspersed with purging, to form successive monolayers until a desired thickness and composition layer has been formed over the substrate. Alternatively, a variety of successive precursor gases different from each other can form a series of stacked monolayers.

Figure 1C:
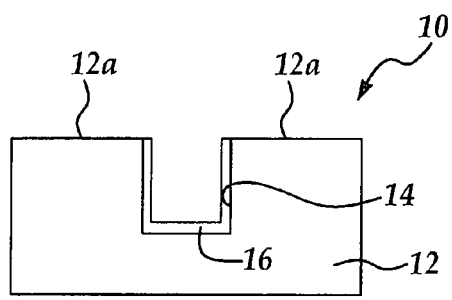

As shown in FIG. 1C, after formation of the bottom electrode 16, the bottom electrode 16 is subjected to a CMP (chemical mechanical planarization) or etch step. This step removes the upper portion 16a (FIG. 1B) of the bottom electrode 16 from the upper surface of the substrate 12.

Figure 1D:
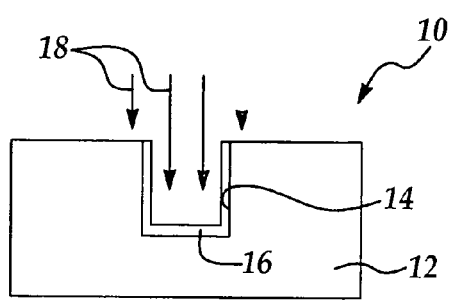

As shown in FIG. 1D, the bottom electrode 16 is next subjected to a thermal anneal step. This can be carried out in a rapid thermal processing (RTP) anneal chamber or in a thermal anneal furnace using $N_2$ (molecular nitrogen) 18.

Figure 1E:
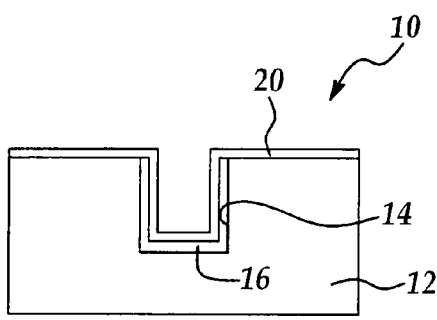

As shown in FIG. 1E, a dielectric layer 20 is next deposited on the bottom electrode 16 and on the upper surface 12a of the substrate 12. The dielectric layer 20 is a high-k dielectric layer which is deposited on the bottom electrode 16 and substrate 12 according to methods which are known by those skilled in the art. The high-k dielectric layer of the fabricated MIM capacitor is preferably $Al_2O_3$. Other suitable dielectric materials include silicon oxide, silicon nitride, tantalum pentoxide, aluminum oxide, hafnium oxide, zirconium oxide, zirconium aluminum silicate, hafnium silicate, hafnium aluminum silicate or other dielectrics having a relatively high dielectric constant.

Figure 1F:
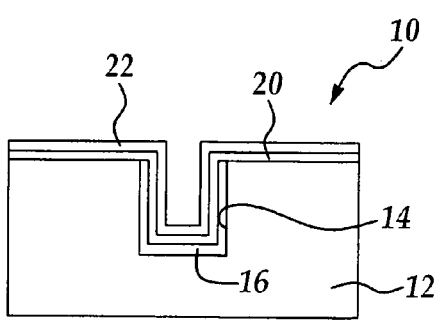

As shown in FIG. 1F, a top electrode 22 is next deposited on the dielectric layer 20. Preferably, the top electrode 22 is titanium nitride (TiN), which is deposited on the dielectric layer 20 using a gas precursor that has no organic content. The top electrode 22 is deposited on the dielectric layer 20 using a plasma-free thermal CVD (chemical vapor deposition) process or an ALD (atomic layer deposition) process. For example, the top electrode 22 may be formed as an atomic layer deposition of titanium nitride (TiN) using $TiCl_4$ and $NH_3$, in which case the desired deposition product is TiN and the principle gas by-product is NH4Cl or HCl gas.

Use of a plasma-free thermal CVD or ALD process to form the top electrode 22 prevents plasma-induced damage to the high-k dielectric layer 20 during the deposition process. Furthermore, the plasma-free thermal CVD or ALD process is preferably carried out at a deposition temperature of no greater than typically about 450 degrees C. to prevent or minimize the formation of an interfacial layer (not shown) between the top electrode 22 and the underlying dielectric layer 20. The top electrode 22 has a thickness of typically about 50~1000 A.

Figure 1G:
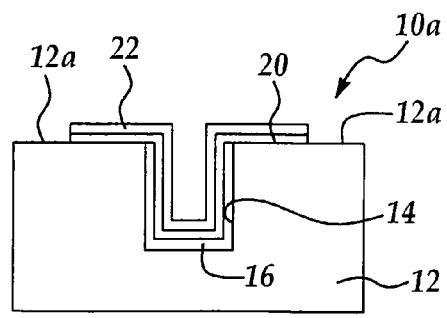

As shown in FIG. 1G, the top electrode 22 and dielectric layer 20 are next patterned to finish the completed MIM capacitor structure 10a. This patterning step is carried out typically by first depositing and then patterning a photoresist layer (not shown) on the top electrode 22. Using etching techniques which are known by those skilled in the art, the portions of the top electrode 22 and underlying dielectric layer 20 which remain uncovered by the patterned photoresist layer are then etched away from the upper surface 12a of the substrate 12.

Figure 2:
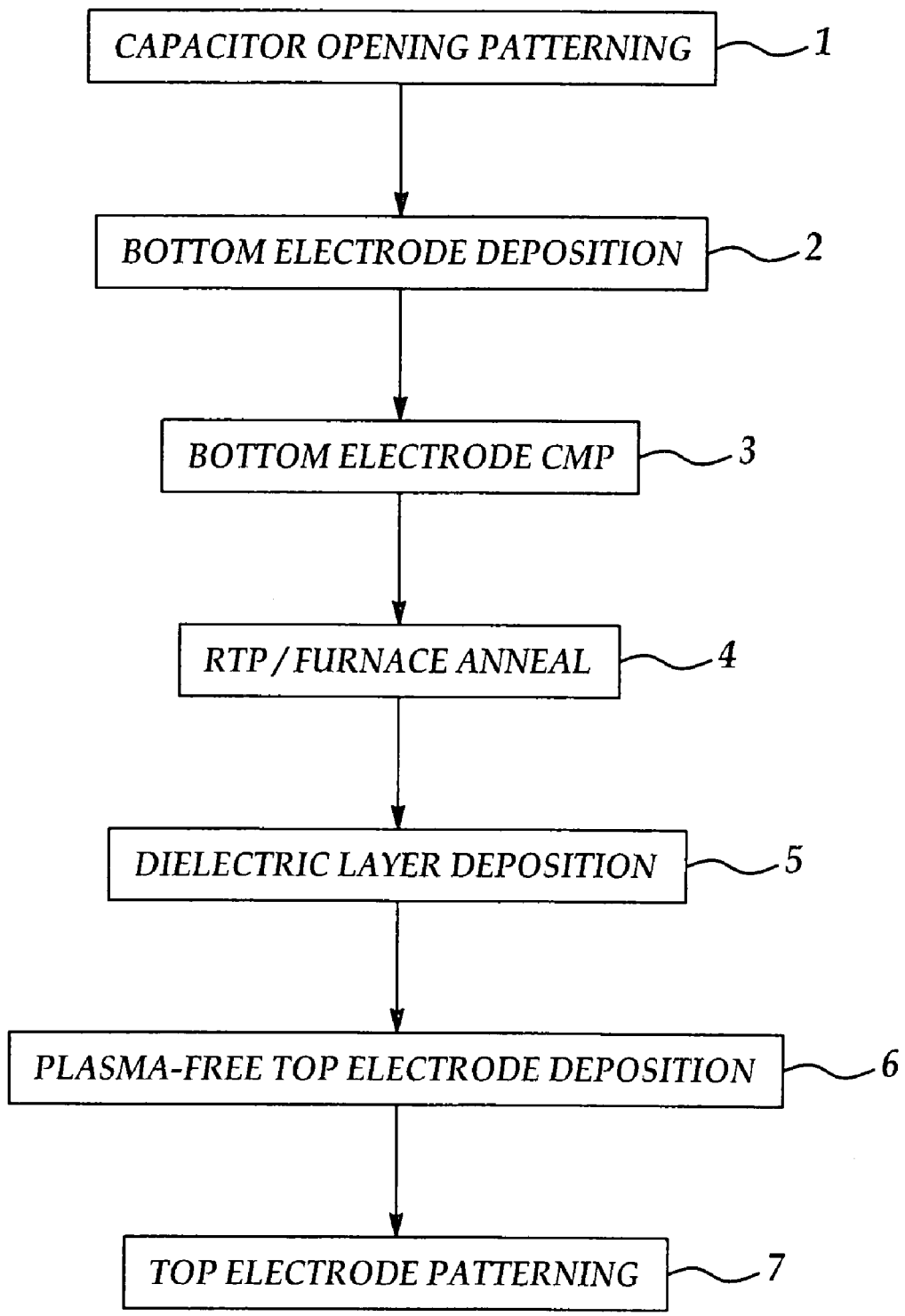
FIG. 2 is a flow diagram illustrating sequential process steps according to the MIM electrode fabrication method of the present invention.

Referring next to FIG. 2, a flow diagram which summarizes sequential process steps according to the method of the present invention, is shown. In process step 1, multiple crown-type capacitor openings are etched in a substrate. In process step 2, a bottom electrode is deposited in each of the capacitor openings. In process step 3, the bottom electrode is subjected to CMP or etch to remove the upper portions of the electrode from the upper surface of the substrate, leaving the electrode covering the sidewalls and bottom of the capacitor opening. In process step 4, the bottom electrode is subjected to a rapid thermal processing or thermal furnace anneal step. Alternatively, the anneal step can take place before the CMP step. In process step 5, a high-k dielectric layer is deposited on the bottom electrode. In process step 6, a top electrode is deposited on the dielectric layer using a plasma-free CVD or ALD deposition process. In process step 7, the top electrode is patterned to complete the MIM capacitor structure.

It will be appreciated by those skilled in the art that the MIM capacitor fabrication method of the present invention results in an MIM capacitor which is characterized by enhanced electrical performance. For example, it has been found that subjecting the bottom electrode to a nitrogen thermal anneal step increases the capacitance by 7%. Furthermore, the fabrication method has been shown to produce a capacitor having a higher breakdown voltage and lower leakage current as compared to capacitors fabricated using conventional methods.

While the preferred embodiments of the invention have been described above, it will be recognized and understood that various modifications can be made in the invention and the appended claims are intended to cover all such modifications which may fall within the spirit and scope of the invention.

What is claimed is:

1. A method of forming an MIM capacitor to reduce interaction of high-K deposition with a bottom electrode comprising:
   providing a substrate;
   providing a capacitor opening in said substrate;
   providing said bottom electrode comprising TiN in said capacitor opening;
   thermally annealing said bottom electrode comprising exposing said bottom electrode to nitrogen gas while subjecting said bottom electrode to thermal processing;
   providing a capacitor dielectric layer in said capacitor opening on said bottom electrode; and
   depositing a top electrode on said capacitor dielectric layer using a plasma-free deposition process.

2. The method of claim 1 wherein said top electrode has a substantially organic-free content.

3. The method of claim 1 wherein said top electrode is deposited on said dielectric layer using a deposition temperature of no greater than about 400 degrees C.

4. The method of claim 3 wherein said top electrode has a substantially organic-free content.

5. A method of forming an MIM capacitor to reduce interaction of high-K deposition with a bottom electrode comprising:
   providing a substrate;
   providing a capacitor opening in said substrate;

providing said bottom electrode comprising TiN in said capacitor opening;

thermally annealing said bottom electrode comprising exposing said bottom electrode to nitrogen gas while subjecting said bottom electrode to thermal processing;

providing a high-K dielectric layer in said capacitor opening on said bottom electrode; and depositing a top electrode comprising TiN on said high-K dielectric layer using a plasma-free deposition.

6. The method of claim 5 wherein said top electrode has a substantially organic-free content.

7. The method of claim 5 wherein said plasma-free deposition process is a thermal chemical vapor deposition process or an atomic layer deposition process.

8. The method of claim 7 wherein said top electrode has a substantially organic-free content.

9. A method of forming an MIM capacitor to reduce interaction of high-K deposition with a bottom electrode comprising:

providing a substrate;

providing a capacitor opening in said substrate;

providing said bottom electrode comprising TiN in said capacitor opening;

subjecting said bottom electrode to chemical mechanical planarization;

thermally annealing said bottom electrode comprising exposing said bottom electrode to nitrogen gas while subjecting said bottom electrode to thermal processing;

providing a high-K dielectric layer in said capacitor opening on said bottom electrode; and depositing a top electrode comprising TiN on said high-K dielectric layer using a plasma-free deposition process at a deposition temperature of no greater than about 400 degrees C.

10. The method of claim 9 wherein said top electrode has a substantially organic-free content.

* * * * *